US012609434B2

(12) United States Patent
Kitt

(10) Patent No.: US 12,609,434 B2
(45) Date of Patent: Apr. 21, 2026

(54) ANTENNA STRUCTURES FOR SPATIAL POWER-COMBINING DEVICES

(71) Applicant: Qorvo US, Inc., Greensboro, NC (US)

(72) Inventor: John Kitt, Camarillo, CA (US)

(73) Assignee: Qorvo US, Inc., Greensboro, NC (US)

( * ) Notice: Subject to any disclaimer, the term of this patent is extended or adjusted under 35 U.S.C. 154(b) by 559 days.

(21) Appl. No.: 18/158,196

(22) Filed: Jan. 23, 2023

(65) Prior Publication Data

US 2023/0291087 A1 Sep. 14, 2023

Related U.S. Application Data

(60) Provisional application No. 63/319,508, filed on Mar. 14, 2022.

(51) Int. Cl.
*H01P 5/16* (2006.01)
*H01P 3/06* (2006.01)
(Continued)

(52) U.S. Cl.
CPC .................. *H01P 5/16* (2013.01); *H01P 3/06* (2013.01); *H01Q 23/00* (2013.01); *H03F 3/19* (2013.01)

(58) Field of Classification Search
CPC . H03F 3/19; H03F 3/211; H01L 24/45; H01L 2924/1423; H01P 3/06; H01P 3/081
(Continued)

(56) References Cited

U.S. PATENT DOCUMENTS 3,023,382 A 2/1962 Borghetti
4,234,854 A 11/1980 Schellenberg et al.
(Continued)

FOREIGN PATENT DOCUMENTS

EP 2469996 A2 6/2012
EP 3279597 A1 2/2018
(Continued)

OTHER PUBLICATIONS

Saito et al., Compact X-Band Synthetic Aperture Radar for 100kg Class Satellite, Mar. 2017IEICE Transactions on Communications E100.B(9) (Year: 2017).*
(Continued)

*Primary Examiner* — Hafizur Rahman

(74) *Attorney, Agent, or Firm* — Withrow & Terranova, P.L.L.C.

(57) ABSTRACT

Power-combining devices and, more particularly, antenna structures for spatial power-combining devices are disclosed. Spatial power-combining devices include amplifier assemblies with amplifiers and antenna structures supported by body structures. Body structures may include inner surfaces that are closer to a center axis of the spatial power-combining device where the inner surfaces have peripheral edges that are inset from remainders of the body structures. Antenna structures are disclosed that are arranged within inset portions such that the antenna structures are bounded on one end by the body structures. When assembled, a portion of a coaxial waveguide section that engages with the amplifier assemblies may bound opposing ends of the antenna structures. By not having body structures bound both ends of antenna structures, amplifier assembly design may be improved to allow smaller sizes for higher frequency operation along with improved manufacturability.

20 Claims, 8 Drawing Sheets

(51) Int. Cl.
    *H01Q 23/00*         (2006.01)
    *H03F 3/19*           (2006.01)
(58) Field of Classification Search
    USPC ........................................................ 330/286
    See application file for complete search history.

(56) References Cited

U.S. PATENT DOCUMENTS

| | | | |
|---|---|---|---|
| 4,424,496 A | 1/1984 | Nichols et al. | |
| 4,612,512 A | 9/1986 | Powell et al. | |
| 4,724,400 A | 2/1988 | Uettgenau | |
| 5,036,335 A | 7/1991 | Jairam | |
| 5,162,803 A | 11/1992 | Chen | |
| 5,214,394 A | 5/1993 | Wong | |
| 5,256,988 A | 10/1993 | Izadian | |
| 5,736,908 A | 4/1998 | Alexanian et al. | |
| 5,920,240 A | 7/1999 | Alexanian et al. | |
| 6,028,483 A | 2/2000 | Shealy et al. | |
| 6,037,840 A | 3/2000 | Myer | |
| 6,181,221 B1 | 1/2001 | Kich et al. | |
| 6,828,875 B2 | 12/2004 | Channabasappa et al. | |
| 7,110,165 B2 | 9/2006 | Martin et al. | |
| 7,215,220 B1 | 5/2007 | Jia | |
| 7,466,203 B2 | 12/2008 | Rector | |
| 8,558,620 B2 | 10/2013 | Fraysse et al. | |
| 8,698,577 B2 | 4/2014 | Sherrer et al. | |
| 8,801,922 B2 | 8/2014 | Wrazel et al. | |
| 8,928,429 B2 | 1/2015 | Song et al. | |
| 9,019,036 B2 | 4/2015 | Kolias et al. | |
| 9,054,427 B2 | 6/2015 | Guy et al. | |
| 9,065,163 B1 | 6/2015 | Wu et al. | |
| 9,276,304 B2 | 3/2016 | Behan et al. | |
| 9,287,605 B2 | 3/2016 | Daughenbaugh, Jr. et al. | |
| 9,293,801 B2 | 3/2016 | Courtney et al. | |
| 9,325,074 B2 | 4/2016 | Chandler | |
| 9,547,344 B2 | 1/2017 | Han | |
| 9,917,343 B2 | 3/2018 | Chieh et al. | |
| 9,954,706 B1 | 4/2018 | Harris et al. | |
| 10,003,118 B2 | 6/2018 | Kitt | |
| 10,009,067 B2 | 6/2018 | Birk et al. | |
| 10,164,667 B1 | 12/2018 | Kitt | |
| 10,263,651 B1 | 4/2019 | Kitt | |
| 10,340,574 B2 | 7/2019 | Mohan et al. | |
| 10,454,433 B2 | 10/2019 | Kitt | |
| 10,651,527 B2 | 5/2020 | Mohan | |
| 10,707,819 B2 | 7/2020 | Yoon et al. | |
| 11,387,791 B2 * | 7/2022 | Yoon ......................... H01P 3/06 | |
| 2002/0118520 A1 | 8/2002 | Baker | |
| 2004/0108903 A1 | 6/2004 | Channabasappa et al. | |
| 2006/0202777 A1 | 9/2006 | Deckman et al. | |
| 2007/0229186 A1 | 10/2007 | Hacker et al. | |
| 2007/0279146 A1 | 12/2007 | Rector | |
| 2010/0065256 A1 | 3/2010 | Wilcoxon et al. | |
| 2011/0006858 A1 * | 1/2011 | Fraysse ................... H03F 3/602 | |
| | | | 333/137 |
| 2011/0300230 A1 | 12/2011 | Peterson et al. | |
| 2013/0003309 A1 | 1/2013 | Stella | |
| 2013/0127678 A1 | 5/2013 | Chandler | |
| 2014/0145794 A1 | 5/2014 | Courtney et al. | |
| 2014/0145795 A1 | 5/2014 | Behan et al. | |
| 2014/0167880 A1 | 6/2014 | Daughenbaugh, Jr. et al. | |
| 2014/0347145 A1 | 11/2014 | Nakamura et al. | |
| 2015/0002238 A1 | 1/2015 | Ryu et al. | |
| 2015/0270817 A1 | 9/2015 | Campbell | |
| 2017/0077577 A1 | 3/2017 | Crouch | |
| 2017/0149113 A1 | 5/2017 | Theveneau et al. | |
| 2017/0179598 A1 | 6/2017 | Kitt | |
| 2018/0187984 A1 | 7/2018 | Manzo | |
| 2018/0294539 A1 | 10/2018 | Kitt | |
| 2019/0007007 A1 | 1/2019 | Kitt | |
| 2019/0067778 A1 | 2/2019 | Mohan | |
| 2019/0067781 A1 | 2/2019 | Mohan et al. | |
| 2019/0067782 A1 | 2/2019 | Mohan et al. | |
| 2019/0067783 A1 | 2/2019 | Mohan et al. | |
| 2019/0067836 A1 | 2/2019 | Mohan | |

| | | |
|---|---|---|
| 2019/0068123 A1 | 2/2019 | Mohan et al. |
| 2019/0068140 A1 | 2/2019 | Mohan et al. |
| 2019/0068141 A1 | 2/2019 | Yoon et al. |
| 2019/0081453 A1 | 3/2019 | Meehan et al. |
| 2019/0140356 A1 | 5/2019 | Mohan |
| 2019/0293099 A1 | 9/2019 | Pitt |
| 2019/0312327 A1 | 10/2019 | Kitt |
| 2020/0041209 A1 | 2/2020 | Valenti et al. |
| 2020/0041210 A1 | 2/2020 | Valenti et al. |
| 2020/0162046 A1 | 5/2020 | Bojkov et al. |
| 2020/0185803 A1 | 6/2020 | Mohan et al. |
| 2020/0274506 A1 | 8/2020 | Yoon et al. |
| 2021/0297048 A1 | 9/2021 | Yoon et al. |
| 2021/0298207 A1 | 9/2021 | Murdock |
| 2022/0247061 A1 | 8/2022 | Kitt et al. |
| 2023/0223673 A1 | 7/2023 | Murdock et al. |

FOREIGN PATENT DOCUMENTS

| | | |
|---|---|---|
| EP | 3454370 A1 | 3/2019 |
| FR | 3040242 A1 | 2/2017 |
| WO | 2017214357 A2 | 12/2017 |
| WO | 2018134495 A1 | 7/2018 |

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, mailed Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Battle TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

(56) References Cited

OTHER PUBLICATIONS

Non-Final Office Action for U.S. Appl. No. 15/637,472, mailed Aug. 10, 2018, 8 pages.

Notice of Allowance for U.S. Appl. No. 15/927,565, mailed Aug. 8, 2018, 8 pages.

Author Unknown, "Interpack 2005: an assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high- temperature superconductivity in water-treated graphite powder," Advanced Materials, vol. 24, Issue 43, Sep. 2012, 19 pages.

Smalc, Martin, et al., "Thermal Performance of Natural Graphite Heat Spreaders," Proceedings of IPACK2005, Jul. 17-22, San Francisco, California, American Society of Mechanical Engineers, 11 pages.

Notice of Allowance for U.S. Appl. No. 15/637,472, mailed Mar. 12, 2019, 7 pages.

Non-Final Office Action for U.S. Appl. No. 15/846,840, mailed Mar. 21, 2019, 4 pages.

Notice of Allowance for U.S. Appl. No. 15/845,225, mailed Jan. 10, 2019, 7 pages.

Notice of Allowance for U.S. Appl. No. 16/166,548, mailed Nov. 29, 2018, 8 pages.

Non-Final Office Action for U.S. Appl. No. 15/933,783, mailed May 1, 2019, 8 pages.

Non-Final Office Action for U.S. Appl. No. 16/042,351, mailed Jul. 5, 2019, 5 pages.

Notice of Allowance for U.S. Appl. No. 15/846,840, mailed Jul. 5, 2019, 7 pages.

Non-Final Office Action for U.S. Appl. No. 15/981,535, mailed Jul. 8, 2019, 5 pages.

Non-Final Office Action for U.S. Appl. No. 16/005,794, mailed Oct. 7, 2019, 11 pages.

Notice of Allowance for U.S. Appl. No. 16/005,794, mailed Jan. 9, 2020, 7 pages.

Corrected Notice of Allowability and Examiner-Initiated Interview Summary for U.S. Appl. No. 16/005,794, mailed May 26, 2020, 6 pages.

Non-Final Office Action for U.S. Appl. No. 16/032,252, mailed Dec. 27, 2019, 5 pages.

Notice of Allowance for U.S. Appl. No. 16/032,252, mailed Jun. 1, 2020, 7 pages.

Notice of Allowance for U.S. Appl. No. 16/042,351, mailed Nov. 18, 2019, 7 pages.

Non-Final Office Action for U.S. Appl. No. 16/008,586, mailed Oct. 24, 2019, 10 pages.

Notice of Allowance for U.S. Appl. No. 16/008,586, mailed Feb. 4, 2020, 8 pages.

Corrected Notice of Allowance and Examiner-Initiated Interview Summary for U.S. Appl. No. 15/846,840, mailed Dec. 12, 2019, 6 pages.

Corrected Notice of Allowance and Applicant-Initiated Interview Summary for U.S. Appl. No. 15/846,840, mailed Dec. 31, 2019, 6 pages.

Notice of Allowance for U.S. Appl. No. 15/981,535, mailed Dec. 31, 2019, 7 pages.

Non-Final Office Action for U.S. Appl. No. 15/981,516, mailed Jul. 17, 2019, 5 pages.

Notice of Allowance for U.S. Appl. No. 15/981,516, mailed Jan. 15, 2020, 7 pages.

Non-Final Office Action for U.S. Appl. No. 15/933,821, mailed Jul. 11, 2019, 7 pages.

Notice of Allowance for U.S. Appl. No. 15/933,821, mailed Jan. 15, 2020, 7 pages.

Non-Final Office Action for U.S. Appl. No. 16/039,435, mailed Jan. 7, 2020, 5 pages.

Notice of Allowance for U.S. Appl. No. 16/039,435, mailed Jun. 17, 2020, 8 pages.

Notice of Allowance for U.S. Appl. No. 16/214,234, mailed May 15, 2020, 8 pages.

Non-Final Office Action for U.S. Appl. No. 16/288,735, mailed May 26, 2020, 9 pages.

Extended European Search Report for European Patent Application No. 23158619.9, mailed Jul. 17, 2023, 9 pages.

Notice of Allowance and Examiner-Initiated Interview Summary for U.S. Appl. No. 17/571,980, mailed Dec. 21, 2023, 11 pages.

Corrected Notice of Allowability for U.S. Appl. No. 17/571,980, mailed Jan. 11, 2024, 6 pages.

Advisory Action, Examiner-Initiated Interview Summary, and AFCP 2.0 Decision for U.S. Appl. No. 16/191,541, mailed May 21, 2020, 5 pages.

Final Office Action for U.S. Appl. No. 16/191,541, mailed Mar. 31, 2020, 8 pages.

Non-Final Office Action for U.S. Appl. No. 16/191,541, mailed Dec. 9, 2019, 7 pages.

Espera Jr., A.H. et al., "3D-printing and advanced manufacturing for electronics," Progress in Additive Manufacturing, Feb. 4, 2019, Springer, 24 pages.

Glasschroeder, J. et al., "Powder-bed-based 3D-printing of function integrated parts," Rapid Prototyping Journal, vol. 21, Issue 2, Emerald Group Publishing Limited, pp. 207-215.

Leigh, S.J. et al., "A Simple, Low-Cost Conductive Composite Material for 3D Printing of Electronic Sensors," PLoS ONE, vol. 7, Issue 11, Nov. 2012, 6 pages.

Sames, W.J. et al., "The Metallurgy and Processing Science of Metal Additive Manufacturing," 2016, available at https://www.osti.gov/servlets/purl/1267051, 76 pages.

Notice of Allowance for U.S. Appl. No. 16/288,735, mailed Oct. 29, 2020, 7 pages.

Non-Final Office Action for U.S. Appl. No. 16/288,735, mailed May 3, 2021, 8 pages.

Non-Final Office Action for U.S. Appl. No. 16/288,761, mailed Apr. 1, 2021, 8 pages.

Examiner-Initiated Interview Summary for U.S. Appl. No. 16/288,761, mailed Jun. 18, 2021, 2 pages.

Notice of Allowance for U.S. Appl. No. 16/288,761, mailed Jun. 29, 2021, 7 pages.

Notice of Allowance for U.S. Appl. No. 16/191,541, mailed Jul. 9, 2020, 7 pages.

Non-Final Office Action for U.S. Appl. No. 16/284,214, mailed Aug. 20, 2020, 5 pages.

Notice of Allowance for U.S. Appl. No. 16/284,214, mailed Jan. 6, 2021, 7 pages.

Non-Final Office Action for U.S. Appl. No. 16/928,092, mailed Oct. 27, 2021, 5 pages.

Notice of Allowance for U.S. Appl. No. 16/928,092, mailed Mar. 30, 2022, 7 pages.

Notice of Allowance for U.S. Appl. No. 16/288,735, mailed Sep. 29, 2021, 8 pages.

Non-Final Office Action for U.S. Appl. No. 16/820,880, mailed Nov. 19, 2021, 10 pages.

Notice of Allowance for U.S. Appl. No. 16/820,880, mailed Mar. 2, 2022, 8 pages.

Non-Final Office Action for U.S. Appl. No. 16/821,531, mailed Nov. 10, 2021, 15 pages.

Notice of Allowance for U.S. Appl. No. 16/821,531, mailed Mar. 10, 2022, 8 pages.

Non-Final Office Action for U.S. Appl. No. 16/821,531, mailed Jun. 16, 2022, 15 pages.

(56)     References Cited

OTHER PUBLICATIONS

Notice of Allowance for U.S. Appl. No. 16/821,531, mailed Sep. 20, 2022, 8 pages.
Non-Final Office Action for U.S. Appl. No. 17/663,878, mailed Sep. 23, 2022, 10 pages.
Notice of Allowance and Examiner-Initiated Interview Summary for U.S. Appl. No. 17/663,878, mailed Jan. 20, 2023, 9 pages.
Notice of Allowance for U.S. Appl. No. 17/245,114, mailed Nov. 23, 2022, 10 pages.
Non-Final Office Action for U.S. Appl. No. 17/811,911, mailed Apr. 4, 2024, 8 pages.
Non-Final Office Action for U.S. Appl. No. 17/571,980, mailed Jun. 30, 2023, 11 pages.

* cited by examiner

ANTENNA STRUCTURES FOR SPATIAL POWER-COMBINING DEVICES

RELATED APPLICATIONS

This application claims the benefit of provisional patent application Ser. No. 63/319,508, filed Mar. 14, 2022, the disclosure of which is hereby incorporated herein by reference in its entirety.

FIELD OF THE DISCLOSURE

The disclosure relates generally to power-combining devices and, more particularly, to antenna structures for spatial power-combining devices.

BACKGROUND

Solid state power amplifiers (SSPAs) are used for broadband radio frequency power amplification in commercial and defense communications, radar, electronic warfare, satellite, and various other communication systems. As modern SSPA applications continue to advance, increasingly higher and higher saturated output power is desired. While millimeter wave (mmWave) gallium nitride (GaN) monolithic microwave integrated circuits (MMICs) have made great strides for use in SSPAs, there are many applications where even higher power densities may be out of reach for a single device. Spatial power-combining devices have been developed that provide a means to combine the output of several separate MMICs to realize a SSPA with much larger output power than that of a single device. Spatial power-combining techniques are implemented by combining broadband signals from a number of amplifiers to provide output powers with high efficiencies and operating frequencies.

One example of a spatial power-combining device utilizes a plurality of solid-state amplifier assemblies that forms a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array. In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures is related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges.

The art continues to seek improved spatial power-combining devices having improved performance characteristics while being capable of overcoming challenges associated with conventional devices.

SUMMARY

The disclosure relates generally to power-combining devices and, more particularly, to antenna structures for spatial power-combining devices. Spatial power-combining devices include amplifier assemblies with amplifiers and antenna structures supported by body structures. Body structures may include inner surfaces that are closer to a center axis of the spatial power-combining device where the inner surfaces have peripheral edges that are inset from remainders of the body structures. Antenna structures are disclosed that are arranged within inset portions such that the antenna structures are bounded on one end by the body structures. When assembled, a portion of a coaxial waveguide section that engages with the amplifier assemblies may bound opposing ends of the antenna structures. By not having body structures bound both ends of antenna structures, amplifier assembly design may be improved to allow smaller sizes for higher frequency operation along with improved manufacturability.

In one aspect, a spatial power-combining device comprises a plurality of amplifier assemblies, each amplifier assembly of the plurality of amplifier assemblies comprising: a body structure comprising a first face, a second face that is on an opposite side of the body structure than the first face, and an outer surface and an inner surface that are arranged between the first face and the second face; an amplifier arranged on the first face of the body structure; and an antenna structure coupled to the amplifier, wherein the antenna structure is positioned outside a peripheral edge of the inner surface. In certain embodiments, the antenna structure comprises a signal conductor on a first side of a substrate and a ground conductor on a second side of the substrate that is opposite the first side, wherein the signal conductor and the ground conductor are positioned outside the peripheral edge of the body structure at the inner surface. In certain embodiments, the substrate forms a tab that protrudes from the body structure, and the signal conductor and the ground conductor are positioned on the tab. In certain embodiments, the amplifier comprises a monolithic microwave integrated circuit (MMIC) amplifier. In certain embodiments, the plurality of amplifier assemblies are radially arranged around a center axis. In certain embodiments, each amplifier assembly of the plurality of amplifier assemblies forms a wedge shape, and the plurality of amplifier assemblies are radially arranged to form a center waveguide section. In certain embodiments, the antenna structure is an output antenna structure, the peripheral edge is a first peripheral edge of the inner surface, and each amplifier assembly of the plurality of amplifier assemblies further comprises an input antenna structure positioned outside a second peripheral edge of the inner surface. The spatial power-combining device may further comprise: an input coaxial waveguide section configured to concurrently provide a signal to the input antenna structure of each amplifier assembly of the plurality of amplifier assemblies; and an output coaxial waveguide section configured to concurrently combine a signal from the output antenna structure of each amplifier assembly of the plurality of amplifier assemblies.

In another aspect, a spatial power-combining device comprises: a coaxial waveguide section comprising an inner conductor and an outer conductor; and a plurality of amplifier assemblies, each amplifier assembly of the plurality of amplifier assemblies comprising: a body structure comprising a first face, a second face that is on an opposite side of the body structure than the first face, and an outer surface and an inner surface that are arranged between the first face and the second face; an amplifier arranged on the first face of the body structure; and an antenna structure coupled to the amplifier, the antenna structure being arranged between the inner conductor and the body structure. In certain embodiments, the antenna structure is positioned outside a peripheral edge of the inner surface of the body structure. In certain embodiments, the antenna structure comprises a signal conductor on a first side of a substrate and a ground conductor on a second side of the substrate that is opposite the first side, wherein the signal conductor and the ground conductor are positioned outside a peripheral edge of the inner surface of the body structure. In certain embodiments: the antenna structure is an output antenna structure, the inner conductor is an output inner conductor, and the outer conductor is an output outer conductor; the coaxial waveguide section is an output coaxial waveguide section; and each amplifier assembly of the plurality of amplifier assemblies further comprises an input antenna structure. The spatial power-combining device may further comprise an input coaxial waveguide section comprising an input inner conductor and an input outer conductor, wherein the input antenna structure is arranged between the input inner conductor and the body structure.

In another aspect, an amplifier assembly comprises: a body structure comprising a first face, a second face that is on an opposite side of the body structure than the first face, and an outer surface and an inner surface that are arranged between the first face and the second face, wherein a length of the inner surface along the first face is less than a length of the outer surface along the first face; an amplifier arranged on the first face of the body structure; and an antenna structure coupled to the amplifier. In certain embodiments, the antenna structure is positioned outside a peripheral edge of the inner surface of the body structure. In certain embodiments, the antenna structure is an output antenna structure, the peripheral edge is a first peripheral edge of the inner surface, and the amplifier assembly further comprises an input antenna structure positioned outside a second peripheral edge of the inner surface. In certain embodiments: the input antenna structure and the output antenna structure are formed on a substrate; the substrate forms a first tab that protrudes from the body structure and the input antenna structure is positioned on the first tab; and the substrate forms a second tab that protrudes from the body structure and the output antenna structure is positioned on the second tab. In certain embodiments, the amplifier comprises a MMIC amplifier. In certain embodiments, the amplifier assembly forms a wedge shape. In certain embodiments, the outer surface is an arcuate outer surface configured to form a portion of a cylindrical shape.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
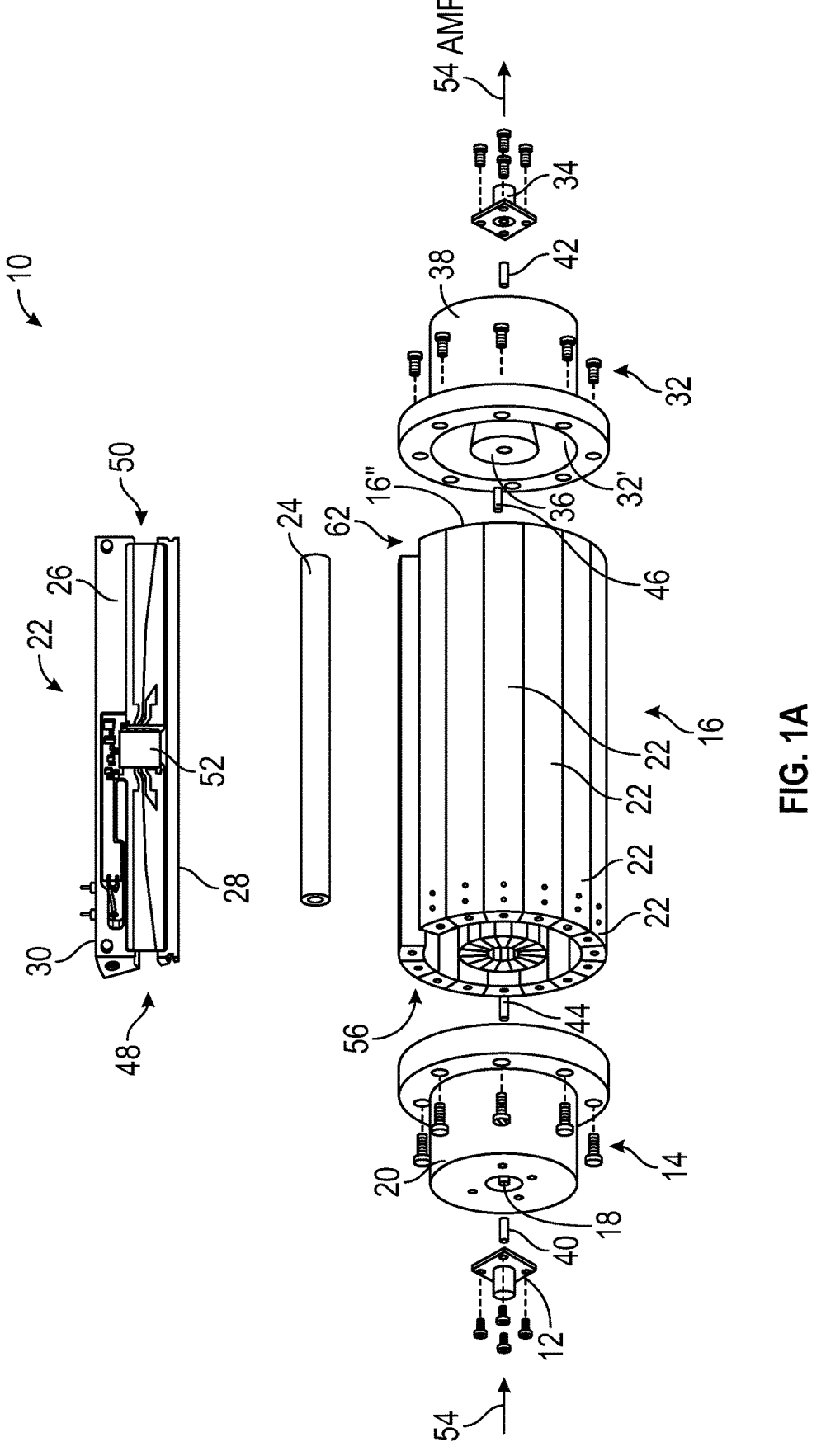
FIG. 1A is a partially-exploded perspective view of an exemplary spatial power-combining device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The disclosure relates generally to power-combining devices and, more particularly, to antenna structures for spatial power-combining devices. Spatial power-combining devices include amplifier assemblies with amplifiers and antenna structures supported by body structures. Body structures may include inner surfaces that are closer to a center axis of the spatial power-combining device where the inner surfaces have peripheral edges that are inset from remainders of the body structures. Antenna structures are disclosed that are arranged within inset portions such that the antenna structures are bounded on one end by the body structures. When assembled, a portion of a coaxial waveguide section that engages with the amplifier assemblies may bound opposing ends of the antenna structures. By not having body structures bound both ends of antenna structures, amplifier assembly design may be improved to allow smaller sizes for higher frequency operation along with improved manufacturability.

The embodiments are particularly adapted to spatial power-combining devices that operate at microwave frequencies, such as, by way of a non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. In some embodiments, by way of non-limiting examples, the operating frequency range includes an operating bandwidth of 4 GHz to 40 GHz, or 2 GHz to 18 GHz, or 2 GHz to 20 GHz, or 20 to 40 GHz, or 25 to 40 GHz, among others.

A spatial power-combining device typically includes a plurality of amplifier assemblies, and each amplifier assembly typically comprises an individual signal path that includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies is arranged coaxially about a center axis. Accordingly, the spatial power-combining device is configured to split, amplify, and combine an electromagnetic signal.

FIG. 1A is a partially-exploded perspective view of an exemplary spatial power-combining device 10. The spatial power-combining device 10 may comprise an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 may include an inner conductor 18 and an outer conductor 20 that radially surrounds the inner conductor 18, thereby forming an opening therebetween. Outer surfaces of the inner conductor 18 and an inner surface of the outer conductor 20 may have gradually changed profiles configured to minimize the impedance mismatch from the input port 12 to the center waveguide section 16.

The center waveguide section 16 comprises a plurality of amplifier assemblies 22 arranged radially around a center axis of the spatial power-combining device 10. In certain embodiments, a center post 24 is provided at the center axis for mechanical support and the plurality of amplifier assemblies 22 may be positioned circumferentially around the center post 24. In other embodiments, the center post 24 may be omitted. In FIG. 1A, the center post 24 is illustrated in an exploded manner. Each amplifier assembly 22 may include a body structure 26 having a predetermined wedge-shaped cross-section, an inner surface 28, and an arcuate outer surface 30. When the amplifier assemblies 22 are collectively assembled radially about the center axis, they form the center waveguide section 16 with a generally cylindrical shape; however, other shapes are possible, such as rectangular, oval, or other geometric shapes.

The spatial power-combining device 10 may also comprise an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 GHz, the output port 34 may comprise a waveguide output port, such as a WR28 or another sized waveguide. The output coaxial waveguide section 32 provides a broadband transition from the center waveguide section 16 to the output port 34. Electrically, the output coaxial waveguide section 32 provides broadband impedance matching from the impedance $Z_c$ of the center waveguide section 16 to an impedance $Z_{p2}$ of the output port 34. The output coaxial waveguide section 32 includes an inner conductor 36 and an outer conductor 38 that radially surrounds the inner conductor 36, thereby forming an opening therebetween. Outer surfaces of the inner conductor 36 and an inner surface of the outer conductor 38 may have gradually changed profiles configured to minimize the impedance mismatch from the output port 34 to the center waveguide section 16. In certain embodiments, a pin 40 connects between the input port 12 and the input coaxial waveguide section 14, and a pin 42 connects between the output port 34 and the output coaxial waveguide section 32. In certain embodiments, the center post 24 connects with the inner conductors 18, 36 by way of screws 44, 46 on opposite ends of the center post 24. The center post 24 is provided for simplifying mechanical connections, may have other than a cylindrical shape, or may be omitted altogether.

Each amplifier assembly 22 comprises an input antenna structure 48 and an output antenna structure 50, both of which are coupled to an amplifier 52. In certain embodiments, the amplifier 52 comprises a monolithic microwave integrated circuit (MMIC) amplifier. In further embodiments, the MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss.

In operation, an input signal 54 is propagated from the input port 12 to the input coaxial waveguide section 14, where it radiates between the inner conductor 18 and the outer conductor 20 and concurrently provides the input signal 54 to the center waveguide section 16. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion to the amplifier 52. The amplifier 52 amplifies the signal portion of the input signal 54 to generate an amplified signal portion that is then transmitted from the amplifier 52 to the output antenna structure 50. The output antenna structures 50 collectively form an output antenna array 62 that operates to provide the amplified signal portions to be concurrently combined inside the opening of the output coaxial waveguide section 32 to form an amplified output signal 54$_{AMP}$, which is then propagated through the output coaxial waveguide section 32 to the output port 34.

Figure 1B:
FIG. 1B is a perspective view of an individual amplifier assembly of the spatial power-combining device of FIG. 1A.
Figure 1B:
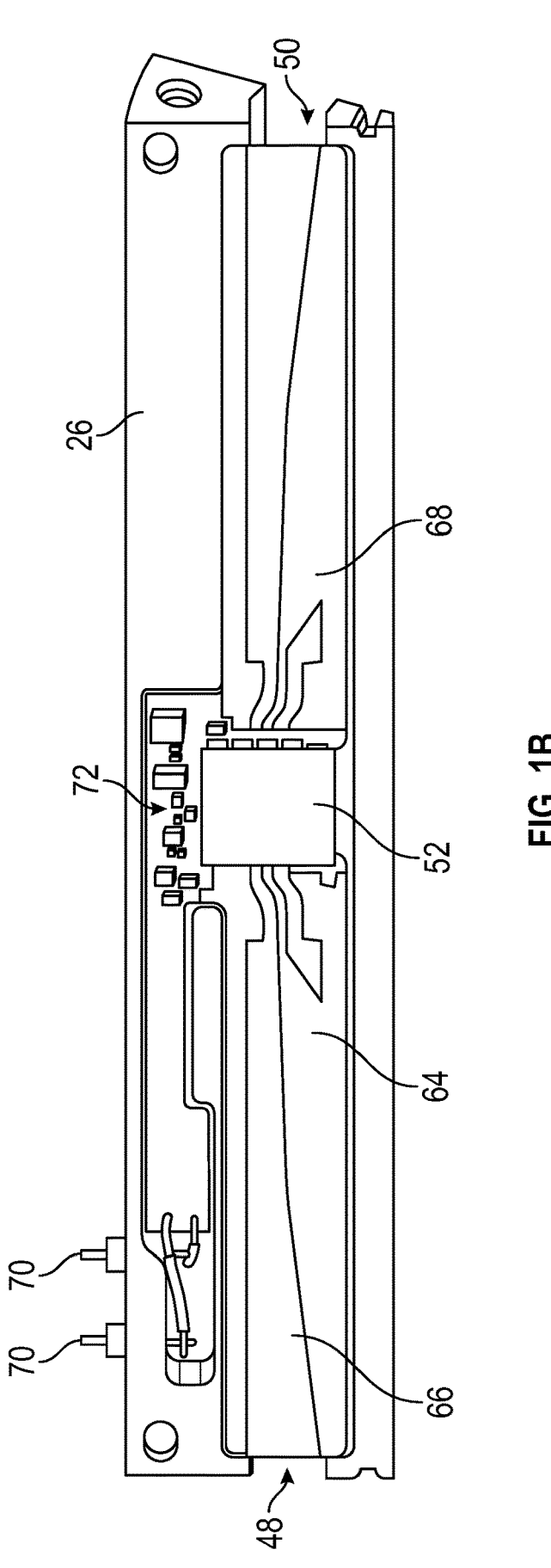

FIG. 1B is a perspective view of an individual amplifier assembly 22 of the spatial power-combining device 10 of FIG. 1A. The input antenna structure 48 may comprise an input signal conductor 64 supported on a first face of a substrate 66 or board, and the output antenna structure 50 comprises an output signal conductor 68 that is also supported on the first face of the substrate 66. The input signal conductor 64 and the output signal conductor 68 are electromagnetically coupled to the amplifier 52. The substrate 66 may comprise a printed circuit board that provides a desired form factor and mechanical support for the input signal conductor 64 and the output signal conductor 68. The input antenna structure 48 also includes an input ground conductor (not visible) on an opposing second face of the substrate 66 to the input signal conductor 64. In a similar manner, the output antenna structure 50 includes an output ground conductor (not visible) on the opposing second face of the substrate 66 to the output signal conductor 68. In other embodiments, the substrate 66 may be substituted with a plurality of substrates or boards. In still other embodiments, the input signal conductor 64, the input ground conductor (not visible), the output signal conductor 68, and the output ground conductor (not visible) are mechanically supported by the body structure 26 such that the substrate 66 may not be present. In certain embodiments, one or more ports 70 are provided for an external voltage input, such as from a direct current voltage source, and corresponding bias circuitry 72 is provided to control the amplifier 52. In certain embodiments, the bias circuitry 72 is arranged on the same substrate 66 as the antenna structures 48, 50. In other embodiments, a separate substrate may be provided for the bias circuitry 72.

In operation, a portion of the input signal (54 in FIG. 1A) is received by the input antenna structure 48 where it radiates between the input signal conductor 64 and the input ground conductor (not visible) and propagates to the amplifier 52 for amplification. For embodiments with a substrate 66, the portion of the input signal (54 in FIG. 1A) radiates between the input signal conductor 64 and the input ground conductor (not visible) through the substrate 66. For embodiments without a substrate 66, the portion of the input signal (54 in FIG. 1A) radiates between the input signal conductor 64 and the input ground conductor (not visible) through air. The amplifier 52 outputs a portion of the amplified signal (54$_{AMP}$ in FIG. 1A) to the output antenna structure 50 where it radiates between the output signal conductor 68 and the output ground conductor (not visible) in a similar manner.

Turning back to FIG. 1A, the spatial power-combining device 10 is typically utilized for high power-combining applications. Accordingly, the amplifier 52 in each of the amplifier assemblies 22 is configured for high power amplification and may therefore generate a high amount of heat. If the operating temperature of each amplifier 52 increases too much, the performance and lifetime of each amplifier 52 may suffer. As previously described, the plurality of amplifier assemblies 22 forms the center waveguide section 16. In this regard, thermal management is needed to effectively dissipate heat in and around the center waveguide section 16. Accordingly, the body structure 26 of each amplifier assembly 22 may typically comprise a thermally conductive material, such as copper (Cu), aluminum (Al), or alloys thereof that are configured to dissipate enough heat from the amplifier 52 to maintain a suitably low operating temperature. In certain applications, the body structure 26 may comprise graphite with an electrically conductive film, such as nickel (Ni), Cu, or combinations thereof. In still further embodiments, the body structure 26 may comprise metal-ceramic composites, including copper-diamond and/or aluminum-diamond.

Figure 2:
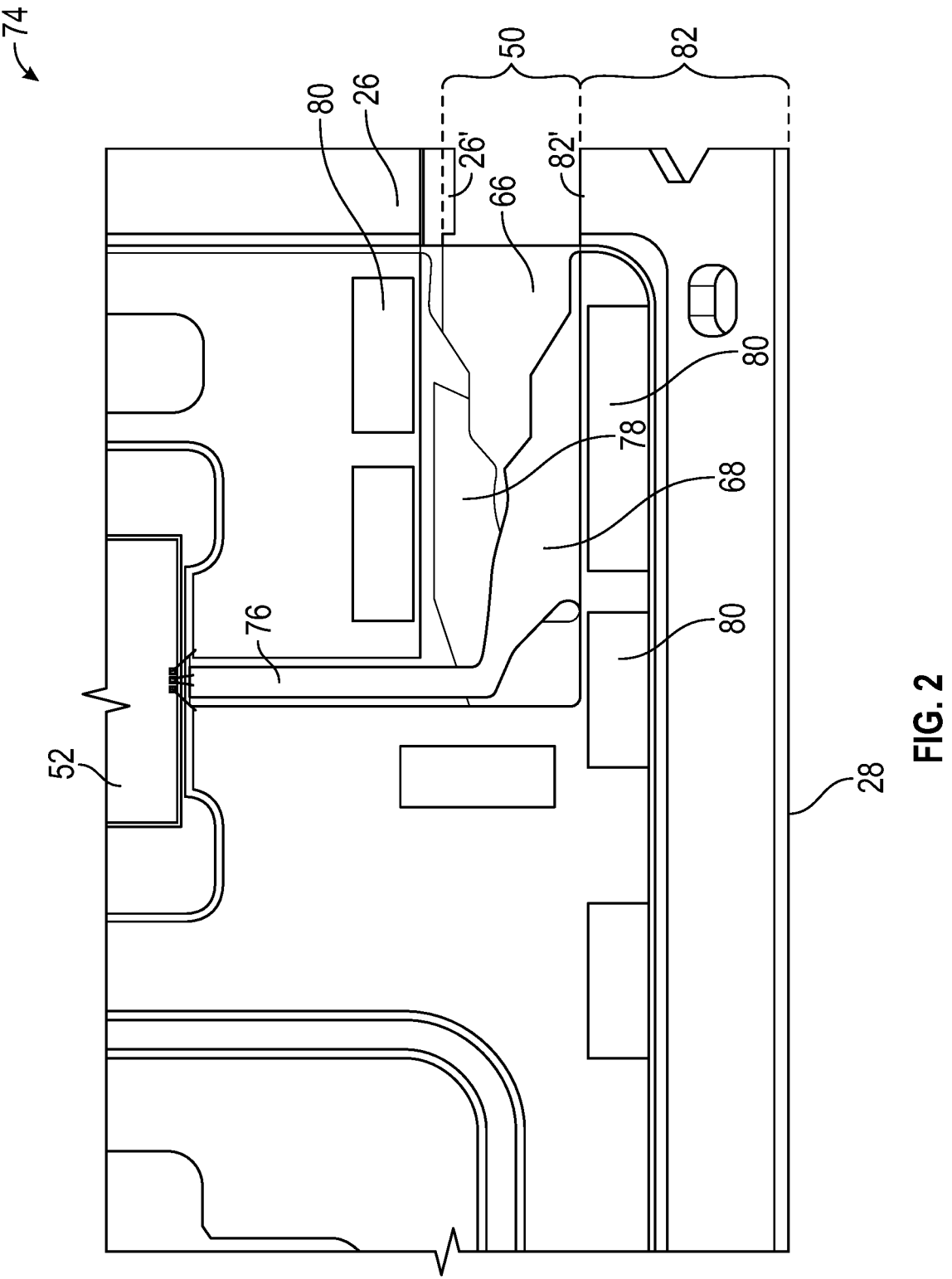
FIG. 2 is a view of a portion of an amplifier assembly that is similar to the amplifier assembly of FIG. 1B and illustrates an arrangement between an output antenna structure and a body structure of the amplifier assembly.

FIG. 2 is a view of a portion of an amplifier assembly 74 that is similar to the amplifier assembly 22 of FIG. 1B and illustrates an arrangement between the output antenna structure 50 and the body structure 26. While only the output end of the amplifier assembly 74 is shown, it is understood that the opposing input end would have a similar structure. The amplifier 52 is connected to the output antenna structure 50 by way of a microstrip feed line 76. The microstrip feed line 76 may be formed by metallization that is patterned on the first face of the substrate 66. In FIG. 2, the view provided is from the perspective of the first face of the substrate 66 and an opposing second face of the substrate 66 is positioned between the first face and the body structure 26. For illustrative purposes, the substrate 66 is represented as semitransparent to illustrate a position of the output ground conductor 78 of the output antenna structure 50 that is on the second face of the substrate 66. One or more electromagnetic interference filters 80 are supported on both the first and second faces of the substrate 66 proximate the output signal conductor 68 and the output ground conductor 78 to help suppress modes and reduce leakage between the amplifier assemblies 22. Certain ones of the electromagnetic interference filters 80 on the second face of the substrate 66 may ground the input signal conductor 68 and output ground conductor 78 to the body structure 26. Other electromagnetic interference filters 80 on the first face of the substrate 66 may ground the input signal conductor 68 and output ground conductor 78 to a body structure of a neighboring amplifier assembly in a fully-assembled spatial power combining device.

The microstrip feed line 76 feeds into the output signal conductor 68 that is positioned, along with the output ground conductor 78, in an opening of the body structure 26. In this regard, the output antenna structure 50 is positioned within the opening of the body structure 26. When multiple amplifier assemblies 74 are radially arranged to form a spatial power-combining device, inner and outer diameters of the opening correspond with a coaxial waveguide channel formed in an assembled spatial power-combining device. The coaxial waveguide channel is configured to propagate electromagnetic signals to and from the amplifier assemblies. By positioning the output antenna structure 50 within the opening, an amplified signal from the amplifier 52 may transition from the microstrip feed line 76 to the coaxial waveguide channel.

As illustrated, the opening is bounded by a protrusion 82 or finger of the body structure 26 that protrudes along the inner surface 28. With this approach, an inner surface 82' of the protrusion 82 defines a portion of an inner conductor of the coaxial waveguide channel along with the inner conductor (36 of FIG. 1A). An inner surface 26' of the body structure 26 that is opposite the inner surface 82' of the protrusion 82 bounds the other side of the output antenna structure 50 and the corresponding opening defines a portion of an outer conductor of the coaxial waveguide channel along with the outer conductor (38 of FIG. 1A). While this structure is sufficient in many spatial power-combining applications, it does place a practical limitation on the overall size of a spatial power-combining device. For example, the protrusion 82 can only be so small before mechanical stability may be compromised. To maintain spurious-free operation, the cross section of the protrusion 82 must scale inversely with the upper operating frequency. Likewise, for a spatial power-combining device with a number N of the amplifier assemblies 74, the cross section of any single protrusion 82 is at most 1/Nth of the total area. Therefore, an upper limit to both the operating frequency range and output power may be limited primarily by how small the protrusion 82 can be constructed. Additionally, the protrusion 82 of the body structure 26 increases difficulty and costs for repeatable manufacturing as the protrusion 82 requires precision machining. For certain operating frequencies, the protrusion 82 may not be mechanically sound until secured within a fully assembled spatial power-combining device, thereby introducing handling related yield loss.

According to principles of the present disclosure, amplifier assemblies for spatial power-combining devices include body structures that only define portions of an outer conductor of the coaxial waveguide channel. In this manner, the protrusions along the inner surface as described above may be avoided. In certain aspects, the inner surface of the body structure is formed inset from the remainder of the body structure and the antenna structures may be positioned proximate inset portions and outside peripheral edges of the body structure at the inner surface. When assembled in a spatial power-combining device, the inner conductor of the coaxial waveguide sections may engage with the inset inner surface of the body structure, thereby bounding the antenna structures. Accordingly, the inner conductor of the coaxial waveguide sections forms a beginning portion of the inner conductor of the coaxial waveguide channel that is outside the body structure. In this manner, the scaling of amplifier assemblies for various operating frequencies may not be limited by the presence of the previously described protrusions.

Figure 3:
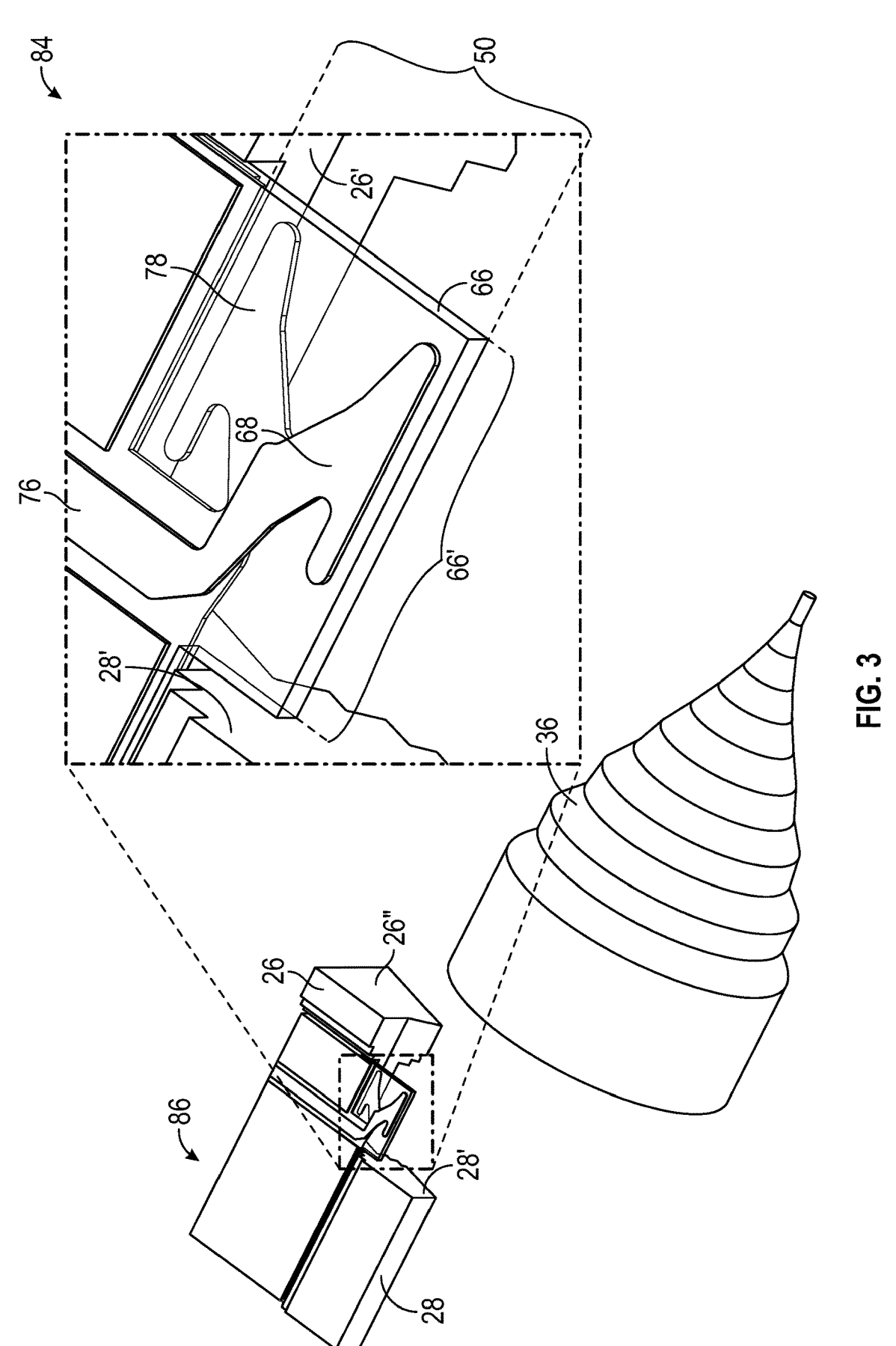
FIG. 3 is an exploded view of a portion of a spatial power-combining device that includes amplifier assemblies with body structures that only define portions of an outer conductor of a coaxial waveguide channel.

FIG. 3 is an exploded view of a portion of a spatial power-combining device 84 that includes amplifier assemblies 86 with body structures 26 that only define portions of an outer conductor of the coaxial waveguide channel. While only the output end of the amplifier assembly 86 is shown, it is understood that the arrangements described herein would be equally applicable to the opposing input end and, in many embodiments, the opposing input end would have an identical structure that mirrors the output end. In this regard, the following description relative to the output end may be applied to the input end of the amplifier assembly 86 by replacing the term "output" with "input."

In FIG. 3, a portion of a single amplifier assembly 86 is illustrated relative to an inner conductor 36 of an output coaxial waveguide section (e.g., 32 of FIG. 1A). FIG. 3 further illustrates an exploded portion of the amplifier assembly 86 that shows the arrangement of the output antenna structure 50 relative to the body structure 26. As illustrated, the inner surface 26' of the body structure 26 defines a portion of an outer conductor of the coaxial waveguide channel in a similar manner as described above for FIG. 2.

As further illustrated in FIG. 3, the inner surface 28 of the amplifier assembly 86 is inset from the remainder of the body structure 26 such that a peripheral edge 28' of the inner surface 28 is inset from a peripheral edge 26" of the remainder of the body structure 26. With such an arrangement, the output antenna structure 50 may be positioned outside a peripheral edge 28' of the inner surface 28 and within the peripheral edge 26" of the remainder of the body structure 26. In certain embodiments, the substrate 66 may include or otherwise form a tab 66' that protrudes from the body structure 26 away from the inner surface 26' and in an offset position from the peripheral edge 28' of the inner surface 28. The remainder of the substrate 66 may extend across and be mechanically supported by the body structure 26. As illustrated, the output signal conductor 68 and the output ground conductor 78 are positioned on the tab 66'. In certain aspects, such an arrangement of the output antenna structure 50 may be referred to as a winged endfire antenna structure. In certain embodiments, the antenna structure 50 may not be directly grounded to the body structure 26, such as by way of the electromagnetic interference filters 80 of FIG. 3. Rather, certain grounding may occur through paths that trace back to the body structure 26 away from the antenna structure 50. For example, while portions of the output ground conductor 78 are floating off of the body structure 26, the output ground conductor 78 may be grounded to the body structure 26 by way of a metallization path back to the body structure 26.

As described above, the inner surface 26' of the body structure 26 defines a portion of an outer conductor of the coaxial waveguide channel. When assembled, the inner conductor 36 will reside in a position that is adjacent or abuts the peripheral edge 28' of the inner surface 28. In this regard, the inner conductor 36 will bound the antenna structure 50 in a position that is opposite the inner surface 26', and accordingly, the inner conductor 36 itself will define portions of the coaxial waveguide channel in which the antenna structure 50 resides. Accordingly, the protrusion 82 of the body structure 26 described above for FIG. 2 is omitted for the amplifier assembly 86 of FIG. 3. In this regard, the size restrictions, yield loss, and manufacturability associated with the protrusion 82 of FIG. 2 may be avoided.

In certain embodiments, the principles described above may be applied to embodiments where increased output power may be realized by increasing a number of amplifiers and associated antenna structures for each amplifier assembly. In this manner, increased amplification may be provided without having to increase a total number of amplifier assemblies. For example, a spatial power-combining device with sixteen amplifier assemblies may be configured as a thirty-two-way spatial power-combining device by arranging two amplifiers and two sets of input and output antenna structures for each of the sixteen amplifier assemblies. This arrangement may be advantageous for higher frequency embodiments where overall size requirements of the spatial power-combining device may necessitate a relative size of each of the thirty-two amplifier assemblies that is too small to be mechanically sound. Combined with the antenna structures as described for FIG. 3, such arrangements may provide increased output powers for even smaller sized spatial power-combining devices.

Figure 4:
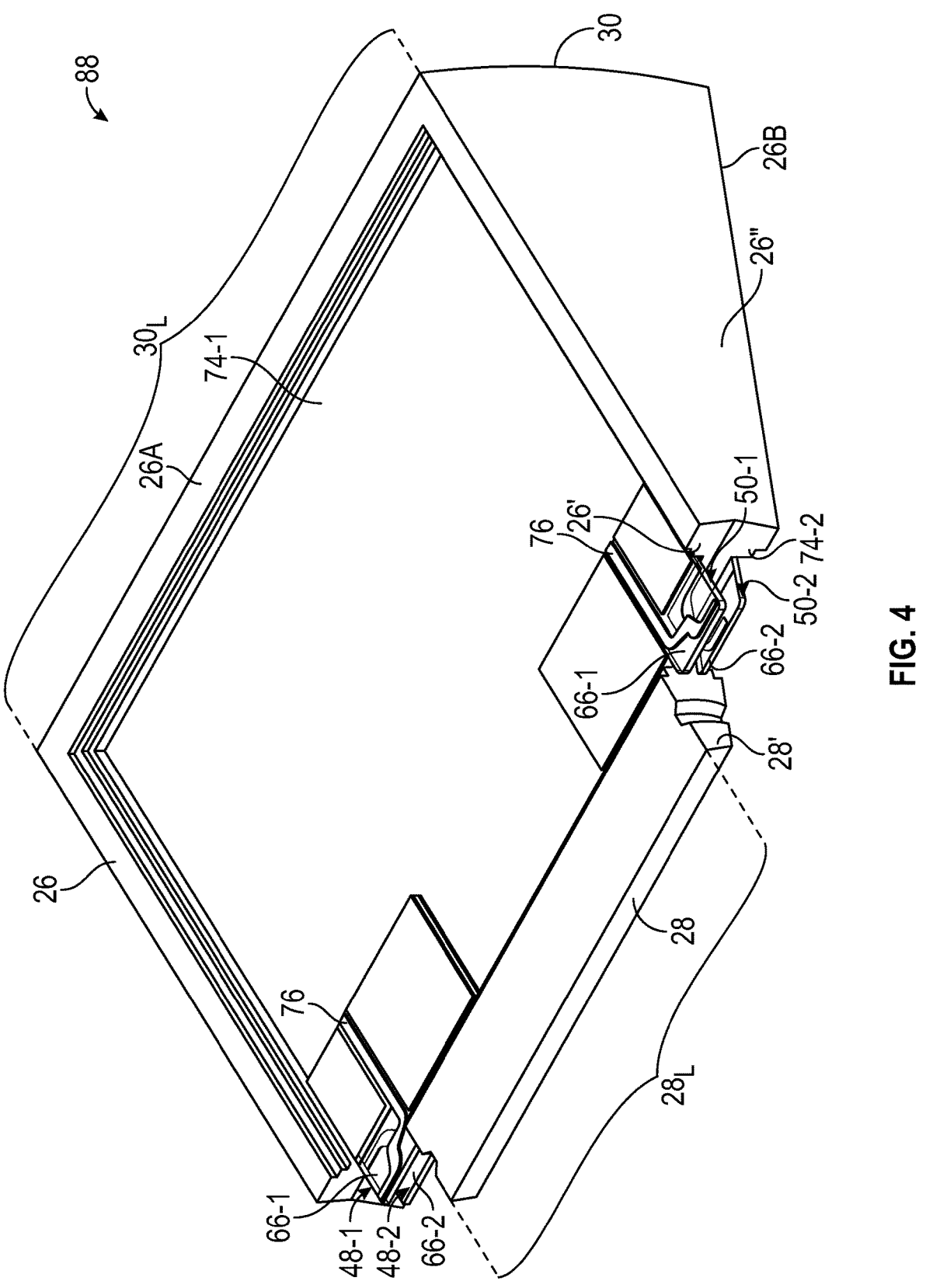
FIG. 4 is a perspective view of an amplifier assembly for a spatial power-combining device that includes multiple sets of antenna structures as described for FIG. 3 to provide increased output power.

FIG. 4 is a perspective view of an amplifier assembly 88 for a spatial power-combining device that includes multiple sets of antenna structures as described for FIG. 3 to provide increased output power. The body structure 26 of the amplifier assembly 88 includes a first recess 74-1 that is formed on a first face 26A of the body structure 26. A first substrate 66-1 that includes a first input antenna structure 48-1 and a first output antenna structure 50-1 is arranged on the first face 26A. For illustrative purposes to show the first recess 74-1, portions of the first substrate 66-1 outside of the microstrip feed lines 76 are omitted. It is understood that the microstrip feed lines 76 provide inputs and outputs to an amplifier that is on the first face 26A. In a similar manner, a second substrate 66-2 that includes another amplifier coupled to a second input antenna structure 48-2 and a second output antenna structure 50-2 is arranged on an opposing second face 26B. While not entirely visible, the second substrate 66-2 may reside in a second recess 74-2 formed in the second face 26B. As further illustrated in FIG. 4, each of the input antenna structures 48-1, 48-2 and the output antenna structures 50-1, 50-2 are positioned outside peripheral edges of the inner surface 28 while still being within peripheral edges 26" of the remainder of the body structure 26. Accordingly, a length 28L of the inner surface 28 as measured from the input end to the output end is less than a corresponding length 30L of the outer surface 30.

FIGS. 5A to 5D illustrate a portion of a spatial power-combining device 90 that includes the amplifier assembly 88 of FIG. 4. For illustrative purposes, many of the elements of the spatial power-combining device 88 are omitted, including one or more portions of the input port 12, the input coaxial waveguide section 14, the center waveguide section 16, the output coaxial waveguide section 32, and the output port 34 as described for FIG. 1A. However, it is understood that the fully assembled spatial power-combining device 90 may include any of these elements as described for FIG. 1A.

Figure 5A:
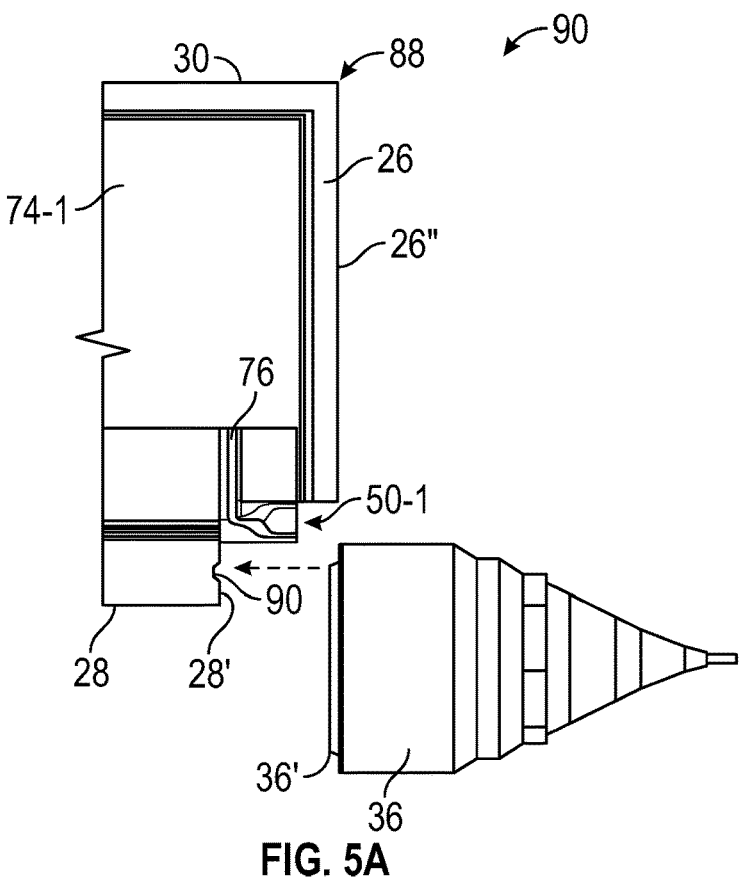
FIG. 5A is an exploded view of a portion of a spatial power-combining device that includes the amplifier assembly of FIG. 4 and illustrates an amplifier assembly relative to the inner conductor.
Figure 5B:
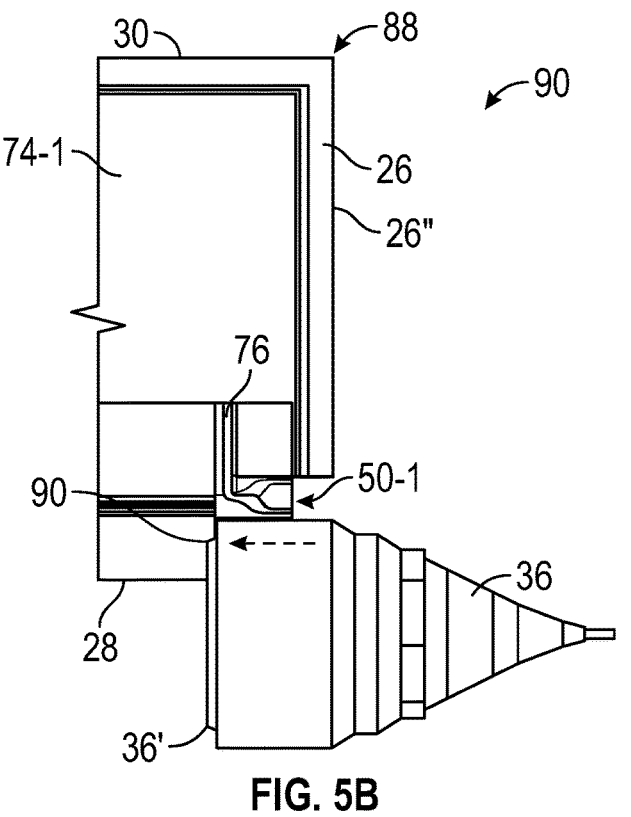
FIG. 5B illustrates the portion of the spatial power-combining device of FIG. 5A after the inner conductor is engaged with the amplifier assembly.
Figure 5C:
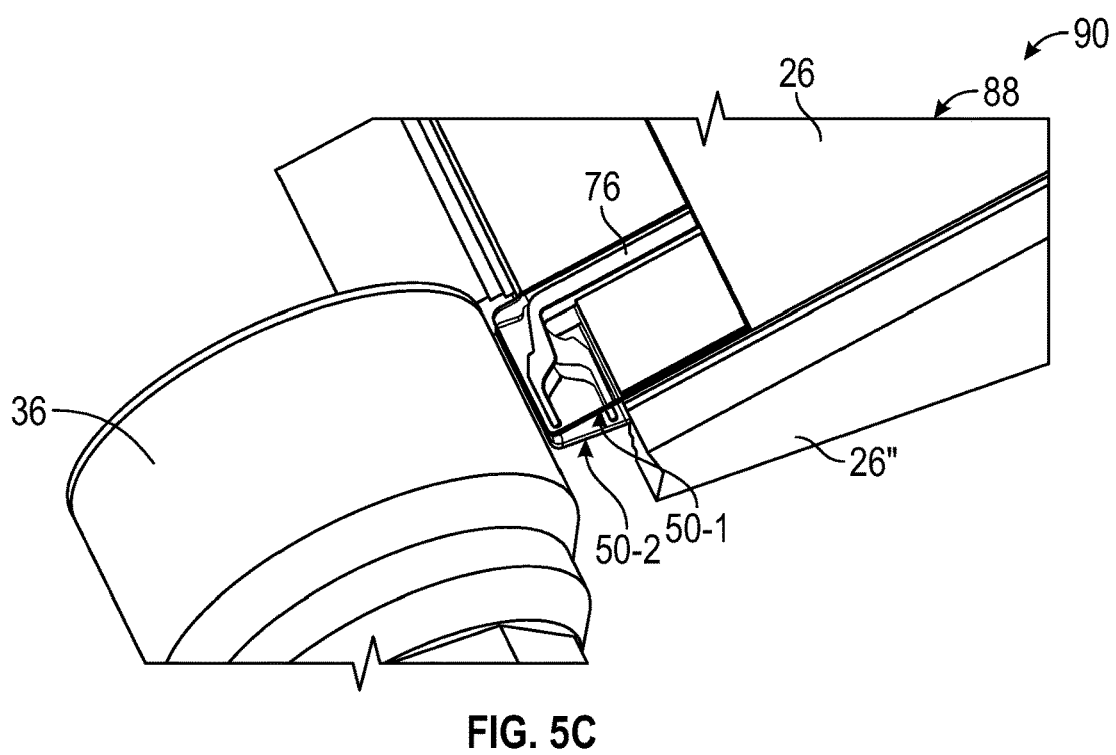
FIG. 5C is a perspective view of the portion of the spatial power-combining device of FIG. 5B.
Figure 5D:
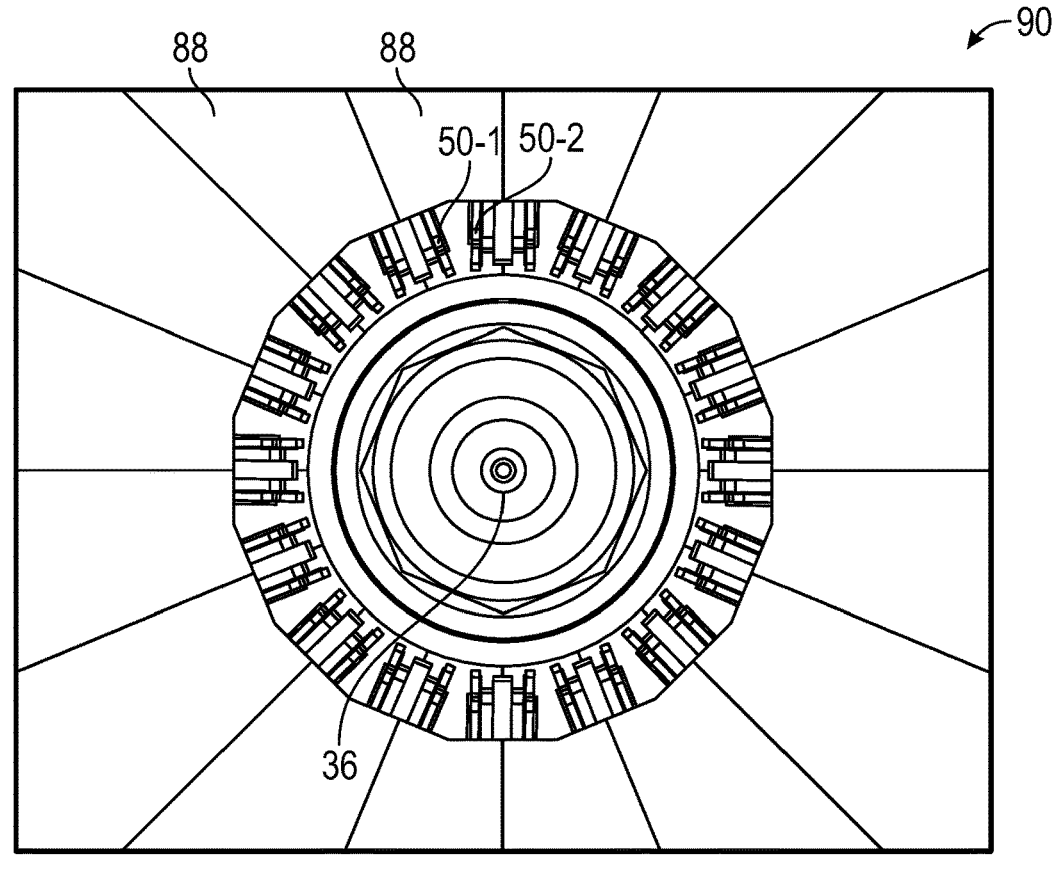
FIG. 5D is an end view of a portion of the spatial power-combining device of FIG. 5A when sixteen of the amplifier assemblies are radially arranged to form a center waveguide section.

FIG. 5A is an exploded view illustrating the amplifier assembly 88 relative to the inner conductor 36. As previously described, the inner conductor 36 may form a portion of an output coaxial waveguide section (e.g., 32 of FIG. 1A). A superimposed dashed arrow in FIG. 5A illustrates a direction in which the inner conductor 36 may be coupled with amplifier assembly 88. The peripheral edge 28' of the inner surface 28 of the amplifier assembly 88 may include an alignment notch 90 that is arranged to receive a corresponding protruding feature 36' of the inner conductor 36. As illustrated in FIG. 5B, the inner conductor 36 may mechanically engage with the body structure 26 at the peripheral edge 28' of the inner surface 28 when assembled. In this manner, a portion of the inner conductor 36 bounds one side of the first output antenna structure 50-1 while portions of the body structure 26 bound the opposing side of the first output antenna structure 50-1. As best illustrated in FIG. 5C, such an arrangement allows the inner conductor 36 to bound sides of both the first output antenna structure 50-1 and the second antenna structure 50-2 of the amplifier assembly 88. The first and second output antenna structures 50-1, 50-2 accordingly reside within a portion of the coaxial waveguide channel formed by the inner conductor 36 and the body structure 26. FIG. 5D is an end view of a portion of the spatial power-combining device 90 when sixteen of the amplifier assemblies 88 are radially arranged to form the center waveguide section 16 of FIG. 1A. As illustrated, the inner conductor 36 bounds the first and second output antenna structures 50-1, 50-2 of each of the amplifier assemblies 88, thereby arranging thirty-two output antenna structures for sixteen amplifier assemblies 88.

Figure 6:
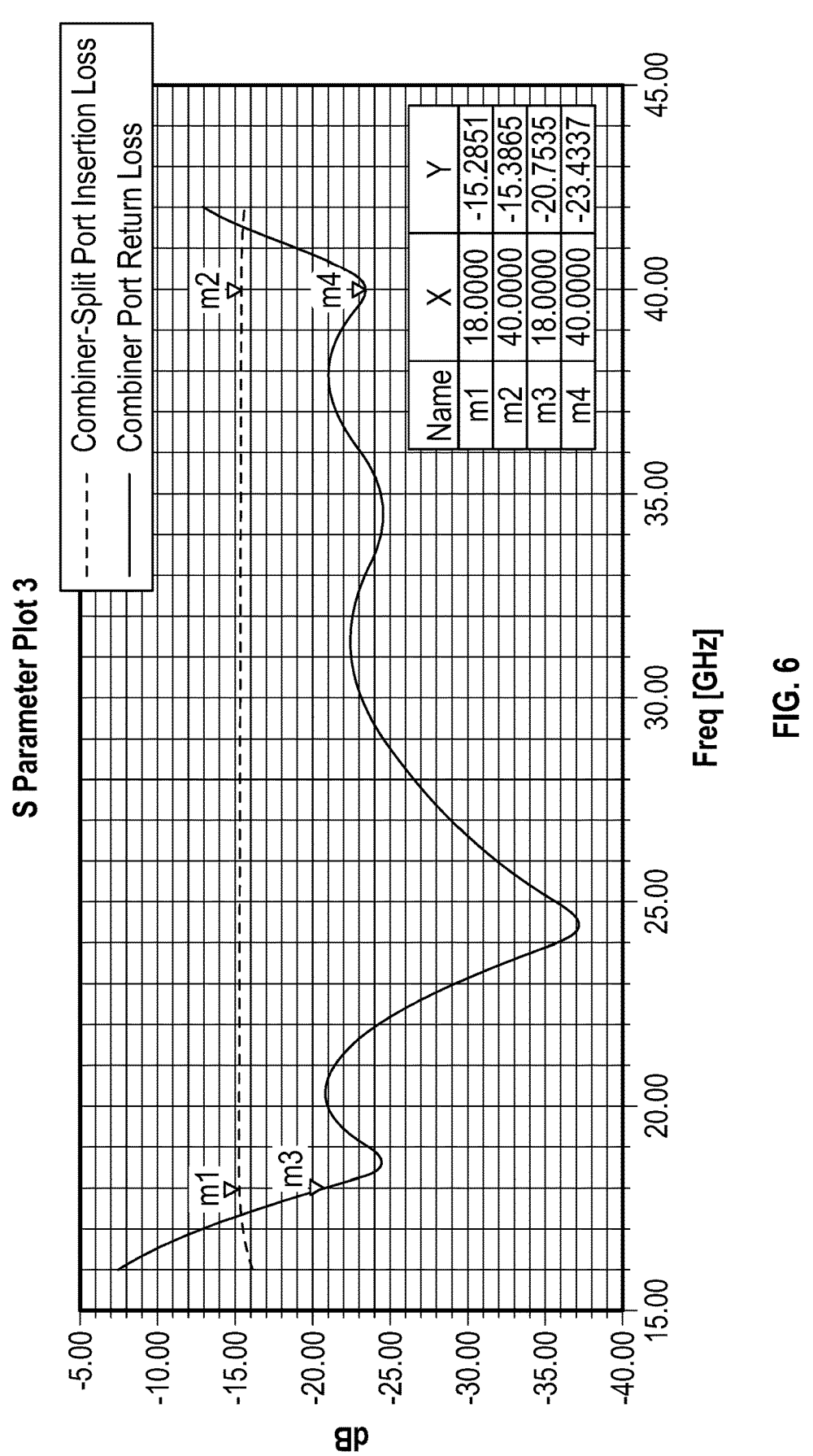
FIG. 6 is a scattering parameters (S-parameters) plot illustrating a frequency response of a spatial power-combining device based on a simulated model of the spatial power-combining device of FIGS. 5A to 5D.

FIG. 6 is a scattering parameters (S-parameters) plot illustrating a frequency response of a spatial power-combining device based on a simulated model of the spatial power-combining device 90 of FIGS. 5A to 5D. The S-parameter magnitude is plotted in decibels (dB) across a GHz frequency range for the spatial power-combining device configured for 20 GHz to 40 GHz operation. The insertion loss, labeled as Combiner-Split Port Insertion Loss, is an indication of how much power is transferred. The insertion loss response is plotted for scattering parameter S(33,1) to represent a single transmission line of the thirty-two transmission lines. In this regard, a 1 to 32 split loss of −15 dB would correspond with a theoretical zero insertion loss where substantially all power from a signal is transferred. As illustrated, the model demonstrates suitable insertion loss across the intended 20-40 GHz frequency range. The return loss, labeled as Combiner Port Return Loss, is an indication of how much power is reflected. When the return loss is equal to 0 dB, then substantially all power from a signal is reflected. Accordingly, it is desirable for return loss to be as low as possible, such as below −20 dB across the intended frequency range. As illustrated, the model indicates a thirty-two power combiner with sixteen amplifier assemblies demonstrates a suitable percent bandwidth for operation and retains a greater than octave bandwidth frequency response, which meets the current demands for millimeter wave (mmWave) spatial power-combining architectures. Compared with a sixteen-way power-combiner, this approach provides doubling the number of MMICs in the current assembly and obtaining roughly a 3 dB higher output power.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising a plurality of amplifier assemblies, each amplifier assembly of the plurality of amplifier assemblies comprising:

a body structure comprising a first face, a second face that is on an opposite side of the body structure than the first face, and an outer surface and an inner surface that are arranged between the first face and the second face such that the outer surface and the inner surface bound opposing sides of the first face and the second face;

an amplifier arranged on the first face of the body structure; and an antenna structure coupled to the amplifier, wherein the antenna structure is positioned to laterally extend outside a peripheral edge of the inner surface in a direction from the inner surface toward a peripheral edge of the body structure.

2. The spatial power-combining device of claim 1, wherein the antenna structure comprises a signal conductor on a first side of a substrate and a ground conductor on a second side of the substrate that is opposite the first side, wherein the signal conductor and the ground conductor are positioned outside the peripheral edge of the body structure at the inner surface.

3. The spatial power-combining device of claim 2, wherein the substrate forms a tab that protrudes from the body structure, and the signal conductor and the ground conductor are positioned on the tab.

4. The spatial power-combining device of claim 1, wherein the amplifier comprises a monolithic microwave integrated circuit (MMIC) amplifier.

5. The spatial power-combining device of claim 1, wherein the plurality of amplifier assemblies are radially arranged around a center axis.

6. The spatial power-combining device of claim 1, wherein each amplifier assembly of the plurality of amplifier assemblies forms a wedge shape, and the plurality of amplifier assemblies are radially arranged to form a center waveguide section.

7. The spatial power-combining device of claim 6, wherein the antenna structure is an output antenna structure, the peripheral edge is a first peripheral edge of the inner surface, and each amplifier assembly of the plurality of amplifier assemblies further comprises an input antenna structure positioned outside a second peripheral edge of the inner surface.

8. The spatial power-combining device of claim 7, further comprising:

an input coaxial waveguide section configured to concurrently provide a signal to the input antenna structure of each amplifier assembly of the plurality of amplifier assemblies; and an output coaxial waveguide section configured to concurrently combine a signal from the output antenna structure of each amplifier assembly of the plurality of amplifier assemblies.

9. A spatial power-combining device comprising:

a coaxial waveguide section comprising an inner conductor and an outer conductor; and a plurality of amplifier assemblies, each amplifier assembly of the plurality of amplifier assemblies comprising:

a body structure comprising a first face, a second face that is on an opposite side of the body structure than the first face, and an outer surface and an inner surface that are arranged between the first face and the second face such that the outer surface and the inner surface bound opposing sides of the first face and the second face;

an amplifier arranged on the first face of the body structure; and an antenna structure coupled to the amplifier, the antenna structure being arranged between the inner conductor and the body structure such that the antenna structure is positioned in a portion of a coaxial waveguide channel defined between a portion of the body structure and a portion of the inner conductor.

10. The spatial power-combining device of claim 9, wherein the antenna structure is positioned outside a peripheral edge of the inner surface of the body structure.

11. The spatial power-combining device of claim 9, wherein the antenna structure comprises a signal conductor on a first side of a substrate and a ground conductor on a second side of the substrate that is opposite the first side, wherein the signal conductor and the ground conductor are positioned outside a peripheral edge of the inner surface of the body structure.

12. The spatial power-combining device of claim 9, wherein:

the antenna structure is an output antenna structure, the inner conductor is an output inner conductor, and the outer conductor is an output outer conductor;

the coaxial waveguide section is an output coaxial waveguide section; and each amplifier assembly of the plurality of amplifier assemblies further comprises an input antenna structure.

13. The spatial power-combining device of claim 12, further comprising an input coaxial waveguide section comprising an input inner conductor and an input outer conductor, wherein the input antenna structure is arranged between the input inner conductor and the body structure.

14. An amplifier assembly comprising:

a body structure comprising a first face, a second face that is on an opposite side of the body structure than the first face, and an outer surface and an inner surface that are arranged between the first face and the second face such that the outer surface and the inner surface bound opposing sides of the first face and the second face, wherein a length of the inner surface along the first face is less than a length of the outer surface along the first face such that a peripheral edge of the inner surface is inset from a peripheral edge of a remainder of the body structure;

an amplifier arranged on the first face of the body structure; and an antenna structure coupled to the amplifier, wherein the antenna structure is positioned to laterally extend outside the peripheral edge of the inner surface in a direction from the inner surface toward the peripheral edge of the body structure.

15. The amplifier assembly of claim 14, wherein the antenna structure is positioned outside the peripheral edge of the inner surface of the body structure.

16. The amplifier assembly of claim 15, wherein the antenna structure is an output antenna structure, the peripheral edge is a first peripheral edge of the inner surface, and the amplifier assembly further comprises an input antenna structure positioned outside a second peripheral edge of the inner surface.

17. The amplifier assembly of claim 16, wherein:

the input antenna structure and the output antenna structure are formed on a substrate;

the substrate forms a first tab that protrudes from the body structure and the input antenna structure is positioned on the first tab; and the substrate forms a second tab that protrudes from the body structure and the output antenna structure is positioned on the second tab.

18. The amplifier assembly of claim 14, wherein the amplifier comprises a monolithic microwave integrated circuit (MMIC) amplifier.

19. The amplifier assembly of claim 14, wherein the amplifier assembly forms a wedge shape.

20. The amplifier assembly of claim 19, wherein the outer surface is an arcuate outer surface configured to form a portion of a cylindrical shape.

\* \* \* \* \*